United States Patent
Zhang

(10) Patent No.: US 10,448,171 B2
(45) Date of Patent: Oct. 15, 2019

(54) MICROPHONE

(71) Applicant: AAC Acoustic Technologies (Shenzhen) Co., Ltd., Shenzhen (CN)

(72) Inventor: Jinyu Zhang, Shenzhen (CN)

(73) Assignee: AAC Acoustic Technologies (Shenzhen) Co., Ltd., Shenzhen (CN)

( * ) Notice: Subject to any disclaimer, the term of this patent is extended or adjusted under 35 U.S.C. 154(b) by 0 days.

(21) Appl. No.: 16/243,187

(22) Filed: Jan. 9, 2019

(65) Prior Publication Data
US 2019/0238999 A1   Aug. 1, 2019

(30) Foreign Application Priority Data
Jan. 31, 2018   (CN) .................... 2018 2 0175024 U

(51) Int. Cl.
*H04R 19/04*   (2006.01)
*H04R 7/04*   (2006.01)
*B81B 3/00*   (2006.01)

(52) U.S. Cl.
CPC ........... *H04R 19/04* (2013.01); *B81B 3/0072* (2013.01); *H04R 7/04* (2013.01); *B81B 2201/0257* (2013.01); *B81B 2203/0127* (2013.01); *H04R 2201/003* (2013.01)

(58) Field of Classification Search
CPC .... H04R 19/04; H04R 7/04; H04R 2201/003; B81B 3/0072; B81B 2201/0257; B81B 2203/0127

USPC .......................................................... 381/174
See application file for complete search history.

(56) References Cited

U.S. PATENT DOCUMENTS

| 2007/0284682 A1* | 12/2007 | Laming | B81C 1/00158 257/416 |
| 2008/0123876 A1* | 5/2008 | Sato | H04R 19/016 381/174 |
| 2013/0161702 A1* | 6/2013 | Chen | B81C 1/00246 257/254 |
| 2015/0264462 A1* | 9/2015 | Okugawa | H04R 19/005 381/174 |

FOREIGN PATENT DOCUMENTS

JP   2002095093 A * 3/2002

* cited by examiner

*Primary Examiner* — Sean H Nguyen
(74) *Attorney, Agent, or Firm* — IPro, PLLC; Na Xu

(57) ABSTRACT

A microphone is provided, including a backplate, a base supporting the backplate, and a diaphragm spaced apart from the backplate and forming a capacitor with the backplate. The base includes a top surface abutting against the backplate and a recess recessed from the top surface in a direction facing away from the backplate, the diaphragm is arranged in the recess, and the recess has a recess bottom. The base further includes a through hole penetrating through the recess bottom. The microphone provided by the present disclosure has an advantage of high reliability.

4 Claims, 2 Drawing Sheets

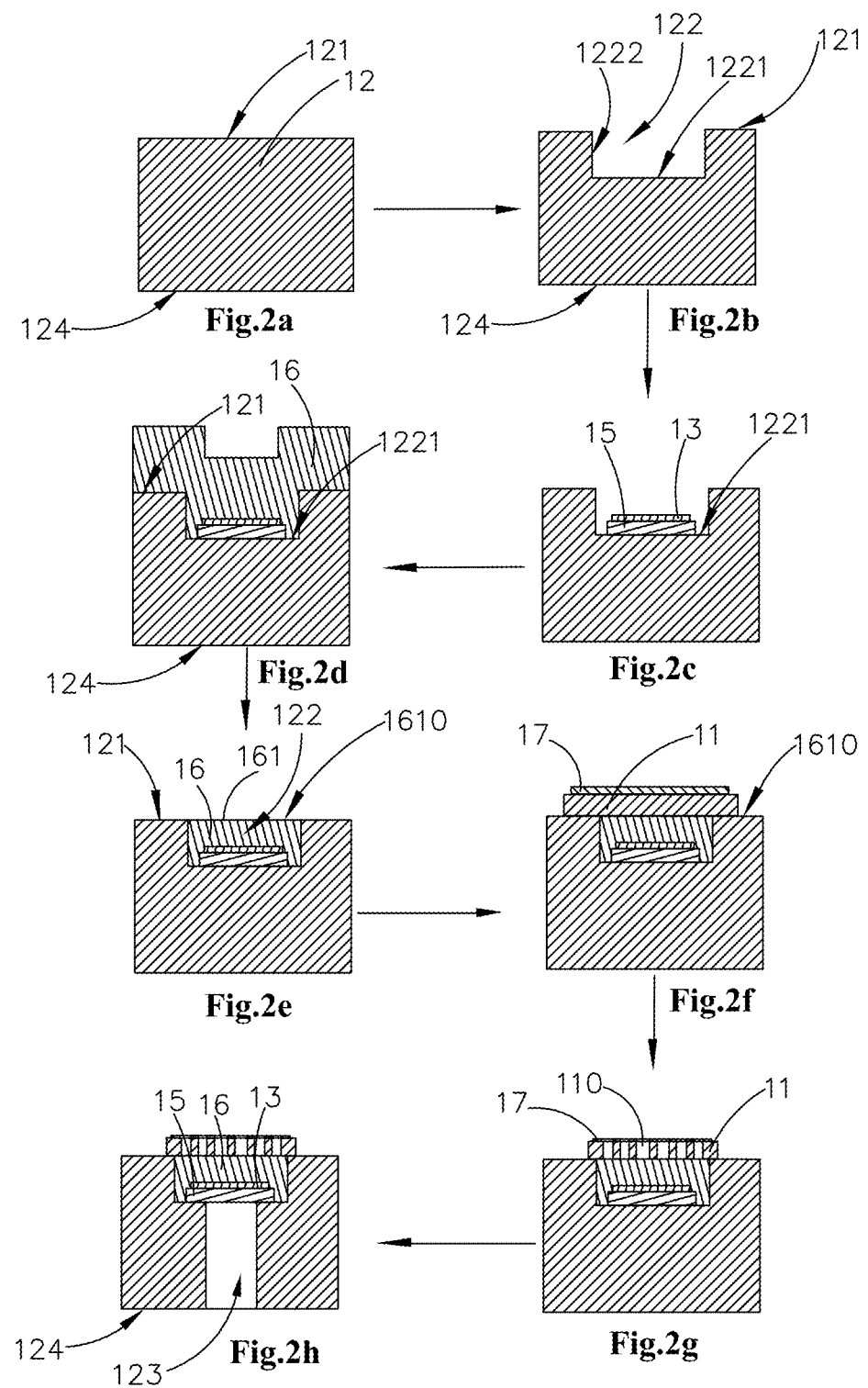

MICROPHONE

CROSS-REFERENCE TO RELATED APPLICATIONS

The present application claims priority to Chinese Patent Application No. 201820175024.4, filed on Jan. 31, 2018, the content of which is incorporated herein by reference in its entirety.

TECHNICAL FIELD

The present disclosure relates to the field of electric-acoustic technologies, and in particular, to a microphone.

BACKGROUND

Microphones in conventional MEMS (Micro-Electro-Mechanical System) is generally formed by stack-based growing of a backplate and a diaphragm etc. on the base through a process of chemical vapor deposition. There is a stepped structure at an edge of the backplate in this structure. The stepped structure is arched towards a direction facing away from the base, so that a receiving space for receiving the diaphragm can be left between the backplate and the base.

The inventors of the present disclosure have found at least the following problems exist in the related art. At present, since the material of the backplate is silicon nitride, in the process of chemical vapor deposition for the backplate, a region where the density decreases due to a difference in growth rate of silicon nitride occurs in the vicinity of the stepped structure. During etching the silicon nitride by an etching solution, the chemical solution will excessively erode the area where the density is lowered, causing a crack in this area of the backplate, thereby weakening the strength of the backplate. Therefore, the stepped portion becomes the weakest in the entire structure of the backplate. During processes of dropping, blowing, etc., an external airflow rushes into a back chamber, the elastic diaphragm is pushed to move toward the backplate, and the diaphragm transfers the pressure to the backplate by contacting with the backplate, causing the backplate to be broken at the fragile stepped portion, further causing damage to the microphone structure, and resulting in low reliability of the microphone.

BRIEF DESCRIPTION OF DRAWINGS

FIGS. 2a-2h are diagrams showing a process of manufacturing a microphone according to an embodiment of the present disclosure.

DESCRIPTION OF EMBODIMENTS

Figure 1:
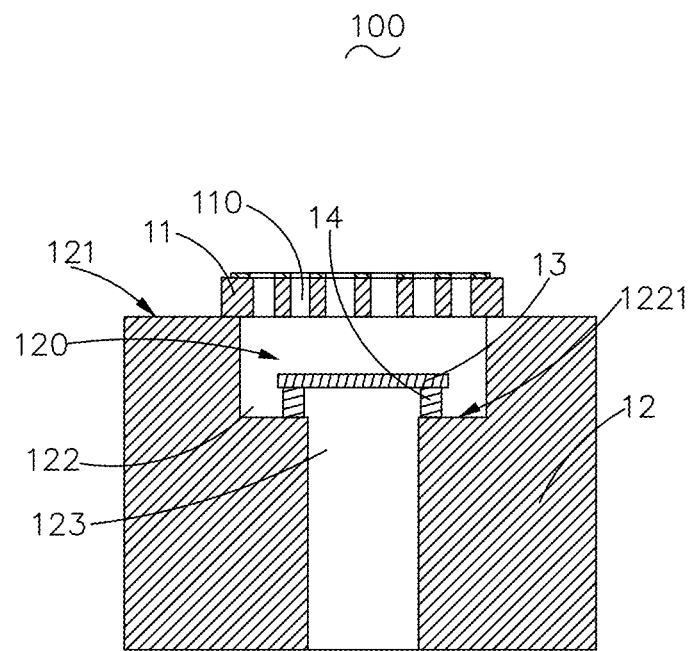
FIG. 1 is a cross-sectional view of a microphone according to an embodiment of the present disclosure.

In order to better understand objectives, technical solutions and advantages of the present disclosure, the embodiments of the present disclosure are described in details with reference to the accompanying drawings. However, it will be apparent to those skilled in the art that, in the various embodiments of the present disclosure, a number of technical details are set forth in order to provide a better understanding of the present disclosure. However, the technical solutions described in the present disclosure can be implemented without these technical details and various changes and modifications can be made based on the following embodiments.

An embodiment of the present disclosure relates to a microphone 100. As shown in FIG. 1, the microphone 100 includes a backplate 11, a base 12 and the diaphragm 13. The backplate 11 is supported by the base 12. The base 12 includes a top surface 121 abutting against the backplate 11. The base 12 is recessed from the top surface 121 toward a direction facing away from the backplate 11, so that a recess 122 is formed. The recess 122 has a recess bottom 1221. A through hole 123 penetrating through the recess bottom 1221 is formed in the base 12.

Compared with the related art, in an embodiment of the present disclosure, since the base 12 includes the top surface 121 abutting against the backplate 11, and the recess 122 recessed from the top surface 121 to a direction facing away from the backplate 11, the recess 122 on the base 12 can be used as a space for receiving the diaphragm 13, and the diaphragm 13 can be arranged in the recess 122, so that the backplate 11 is not required to be arched to form a space for receiving the diaphragm 13. Therefore, a stepped structure can be omitted from the backplate 11, so that the area where the density of the backplate 11 is degraded during a growth process can be avoided, thereby fundamentally avoiding cracking of the backplate caused by excessive etching in the reduced density region, ensuring the strength of the backplate 11 and improving the reliability of the microphone 100.

In one embodiment, the backplate 11 covers the recess 122. Therefore, the backplate 11 can protect the diaphragm 13 arranged in the recess 122.

In one embodiment, the diaphragm 13 covers the through hole 123, thereby enabling the diaphragm 13 to separate the recess 122 from the space defined by the through hole 123.

It can be understood that the diaphragm 13 is fixed to the recess bottom 1221, which can avoid the positional movement of the diaphragm 13 during vibration. The positional movement of the diaphragm 13 during vibration may affect the sounding effect of the microphone 100 and even cause that the microphone 100 cannot sound normally.

In one embodiment of the present disclosure, the microphone 100 further includes a connecting portion 14 for fixing the diaphragm 13 to the recess bottom 1221. The connecting portion 14 abuts against the recess bottom 1221 and supports the diaphragm 13.

It can be understood that a depth of the recess 122 is greater than a sum of a thickness of the diaphragm 13 and a thickness of the connecting portion 14, so that a stacking structure composed of the diaphragm 13 and the connecting portion 14 does not protrude from the top surface 121. Therefore, the backplate 11 can cover the recess 122.

It should be noted that a front chamber 120 is formed between the diaphragm 13 and the backplate 11, a sound receiving hole 110 is formed in the backplate 11, and the front chamber 120 is in communication with the sound receiving hole 110. Therefore, sound can enter into the front chamber 120 through the sound receiving hole 110, causing vibration of the diaphragm 13.

Referring to FIGS. 2a-2h, the manufacture of the microphone 100 provided by an embodiment of the present disclosure will be briefly described below.

In a first step, as shown in FIG. 2a, an unprocessed base 12 is provided. The base 12 includes a top surface 121 and a bottom surface 124 arranged opposite to the top surface 121.

In a second step, as shown in FIG. 2b, a recess 122 is etched on the base 12 from the top surface 121 toward the bottom surface 124. The recess 122 includes a sidewall 1222 connected to the top surface 121 and a recess bottom 1221 connected to the sidewall 1222.

In a third step, as shown in FIG. 2c, an insulating layer 15 and a diaphragm 13 are sequentially grown on the recess bottom 1221.

In a fourth step, as shown in FIG. 2d, a sacrificial layer 16 protruding from the top surface 121 is grown from the recess bottom 1221 toward a direction facing away from the bottom surface 124.

In a fifth step, as shown in FIG. 2e, the sacrificial layer 16 is flattened, leaving only a portion of the sacrificial layer 16 located within the recess 122. The portion of the sacrificial layer 16 left includes an upper surface 161. The upper surface 161 and the top surface 121 jointly forms a plane 1610.

In a sixth step, as shown in FIG. 2f, the backplate 11 and a fixing electrode 17 are sequentially grown on the plane 1610.

In a seventh step, as shown in FIG. 2g, a sound receiving hole 110 is etched on the backplate 11 and the fixing electrode 17.

In an eighth step, as shown in FIG. 2h, the through hole 123 penetrating through the bottom surface 124 is etched on a side of the insulating layer 15 facing away from the diaphragm 13.

In a ninth step, the sacrificial layer 16 and a portion of the insulating layer 15 as shown in FIG. 2h are etched with an etching solution to form the microphone 100 as shown in FIG. 1. A space formed by etching off the sacrificial layer 16 in the recess 122 constitutes a front chamber 120. A remaining portion of the insulating layer 15 after etching forms the connecting portion 14.

In one embodiment of the present disclosure, a commonly adopted material of the backplate 11 is silicon nitride, a commonly adopted material of the diaphragm 13 is polysilicon, a commonly adopted material of the sacrificial layer 16 is silicon oxide, and a commonly adopted material of the base 12 is monocrystalline silicon.

A person skilled in the art can understand that the above embodiments are specific embodiments for implementing the present disclosure, and various changes can be made in in practical application without departing from the spirit and scope of the present disclosure.

What is claimed is:

1. A microphone, comprising:
    a backplate;
    a base supporting the backplate; and
    a diaphragm spaced apart from the backplate, the diaphragm and the backplate forming a capacitor,
    wherein the base comprises a top surface, a bottom surface opposite to the top surface and a recess recessed from the top surface toward the bottom surface, the recess comprises a recess bottom and a sidewall connecting the top surface and the recess bottom, the backplate is fixed to the top surface and covers the recess, the diaphragm is arranged in the recess and is fixed to the recess bottom, the base further comprises a through hole penetrating through the recess bottom and the bottom surface, the diaphragm covers the through hole.

2. The microphone as described in claim 1, further comprising a connecting portion fixing the diaphragm to the recess bottom, wherein the connecting portion is abutted against the recess bottom and supports the diaphragm.

3. The microphone as described in claim 2, wherein a depth of the recess is greater than a sum of a thickness of the diaphragm and a thickness of the connecting portion.

4. The microphone as described in claim 1, wherein a front chamber is formed between the diaphragm and the backplate, a sound receiving hole is formed in the backplate, and the front chamber is in communication with the sound receiving hole.

* * * * *